United States Patent [19]
Davignon et al.

[11] Patent Number: 5,591,353
[45] Date of Patent: Jan. 7, 1997

[54] REDUCTION OF SURFACE COPPER THICKNESS ON SURFACE MOUNT PRINTED WIRE BOARDS WITH COPPER PLATED THROUGH HOLES BY THE CHEMICAL PLANARIZATION METHOD

[75] Inventors: John J. Davignon, Austin; Don J. Jermain, Georgetown, both of Tex.; Leslie O. Connally, Albuquerque, N.M.

[73] Assignee: Texas Instruments Incorporated, Dallas, Tex.

[21] Appl. No.: 292,474

[22] Filed: Aug. 18, 1994

[51] Int. Cl.⁶ .................................................. H05K 3/00
[52] U.S. Cl. ............................. 216/18; 216/17; 216/20; 216/38
[58] Field of Search ................................ 216/13, 17, 18, 216/20, 33, 36, 39, 38; 427/96, 97, 98

[56] References Cited

U.S. PATENT DOCUMENTS

| | | |
|---|---|---|
| 4,529,477 | 7/1985 | Lundberg et al. ........................ 216/17 |
| 4,964,948 | 10/1990 | Reed ........................................ 216/18 |

FOREIGN PATENT DOCUMENTS 175653  7/1993  Japan.

*Primary Examiner*—Thi Dang
*Attorney, Agent, or Firm*—René E. Grossman; Richard L. Donaldson

[57] ABSTRACT

A method of fabricating a printed wiring board (1) and a printed wiring board module (17) by providing a first board (1) having a pair of major opposing surfaces, a via (3) having walls extending between the surfaces and a layer of copper (5) disposed on at least one surface and extending along the walls of the via. The copper disposed in the via is protected against a subsequent etching of the copper on the surface by filling the remaining portion of the via with an epoxy (7) and then reducing the thickness of the layer of copper on the surface. The layer of copper and the epoxy are then planarized. A core layer and a second board are then provided and the first and second boards are secured to opposing sides of the core layer. A second via having walls and extending through the first and second boards and the core layer is then formed and a layer of copper is disposed on the walls of the second via and the surface. The electrically conductive material on the surface is then patterned and etched to form an electrically conductive pattern.

20 Claims, 1 Drawing Sheet

REDUCTION OF SURFACE COPPER THICKNESS ON SURFACE MOUNT PRINTED WIRE BOARDS WITH COPPER PLATED THROUGH HOLES BY THE CHEMICAL PLANARIZATION METHOD

BACKGROUND OF THE INVENTION

1. Field of the Invention

This invention relates to a method of forming very narrow electrically conductive lines and narrow spacing between such lines on printed wiring boards (PWBs).

2. Brief Description of the Prior Art

The continual decrease in the size of electronic components has resulted in a continuing effort to obtain finer circuit lines and spacing between the lines on printed wiring boards. In the manufacture of certain types of printed wiring board systems or modules, particularly those systems having a pair of printed wiring boards with a core therebetween, sequential copper plating steps are required. Generally, plating first takes place on the initial printed wiring boards with the build-up of copper on the board surfaces and vias or holes through the board electrically interconnecting the two major surfaces. That board and a second board on which a similar plating operation has taken place are then bonded to a core layer positioned between the two boards. The module is plated with copper including vias or holes through the two boards and the core to electrically interconnect the two initial boards. These steps involve the drilling of holes in one or both boards, plating of those holes, bonding of the boards to the core layer to form a module, then drilling additional holes through the entire module with subsequent plating of the additional holes. A result of this sequential plating requirement is that there is a build-up of the plating material on the surfaces of the initial boards from the plural plating steps. This large build-up of copper provides a problem in obtaining fine lines of copper and fine spaces between the copper lines. The final etching of the surface copper is dependent upon the etch factor of the etchant chemistry and the copper thickness on the surface to be etched. A consequence of this problem has been relatively poor yields and a large minimum line and space width.

Attempts have been made to improve the etch factor through the use of chemical additives or by minimizing the amount of copper plated on the board surfaces. While both of these approaches are valid and have shown improvement in the ability to reduce line widths, they have limited applications. Even with a greatly improved etch factor due to etchant chemistry, the surface copper thickness will dominate line widths. It is therefore apparent that other approaches are necessary in order to provide line widths and spacing between lines of reduced dimensions while improving the yields.

SUMMARY OF THE INVENTION

In accordance with the present invention, there is provided a procedure which reduces the surface copper thickness to any point desirable within the control limits of the etcher. This reduced thickness opens the etching window and allows for a more reliable procedure for reduction of line width and spacing between lines, thereby increasing the route density of the boards.

Briefly, in accordance with the present invention, vias are drilled through the initial printed wiring boards and the boards are then plated with copper on both sides and in the vias or through holes. In general, the thickness of the copper in the vias is from about 1 to about 1.5 mils and the thickness of the copper on the board surface is from about 1.5 to about 2 mils. The plated vias are then protected from subsequent etching steps or medium used to reduce the thickness of surface copper by filling the vias with a thermosetting resin, preferably an epoxy, and any epoxy extending over the copper surface is removed to the same level or below the level of the copper surface, such as by rubbing with an abrasive to expose all of the copper surface for later etching. This via hole filling can be accomplished in a special screen printing or during the lamination step when the initial boards are bonded to a core layer of metal or reinforced polymer with a B-stage adhesive or prepreg, preferably a B-stage or partially cured epoxy resin.

The level of the epoxy in the via is then lowered to a level between the upper and lower surfaces of the copper layer on the board surface, knee of the hole, this being about 0.6 mils below the upper level of the copper layer, preferably by chromic etchback or by plasma etch. Because of plating non-uniformities, the plated copper around the border of the board, generally around the plating clamps, is much thinner than in the central region of the board and would be etched bare if not protected. Therefore, this region is now protected from the etchant to be used by coating it with a primary photoimageable resist which is exposed and developed with a border protecting pattern.

The thickness of the copper layer on the board is then non-destructively measured using a Betascope, MR4000 or other resistance measuring instruments and the board is then chemically etched using any etchant for copper which will not attack the epoxy to remove some of the copper to a thickness of from about 0.2 mil to about 0.5 mil greater than the initial copper foil thickness. The etching time is determined from the thickness of the copper layer at commencement of the etch as measured to planarize the copper layer. Etching of the copper is preferably accomplished with a copper chloride ($CUCl_2$) etchant, though any alkaline etchant or similar wet chemistry can be used. The surface of the board with reduced thickness of copper is then planarized by etching the epoxy which may have protruded from the via and has a nub above the surface of the copper layer, using the same etching procedure as used in the prior epoxy etchback. The first board is now ready for further processing by standard techniques.

The vias are then drilled through the module comprising the two boards and the core layer with subsequent plating in the through holes and build-up of copper on the surfaces of the initial boards. Since copper was previously removed from the surfaces of the initial boards, the build-up of copper results in a much thinner layer of copper on the module surface than was provided in the prior art and provides more reliable etching of fine lines and fine spacing of the copper lines than was available in the prior art to provide the desired copper wiring pattern with high yields.

DESCRIPTION OF THE PREFERRED EMBODIMENT

Figure 1A:
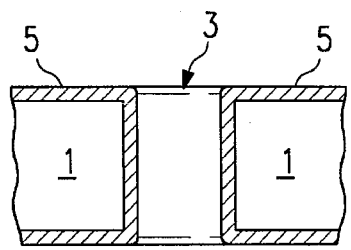
FIGS. 1a to 1f are a process flow for fabrication of a printed wiring board in accordance with the present invention.
Figure 1B:
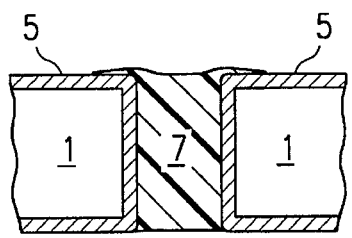
Figure 1C:
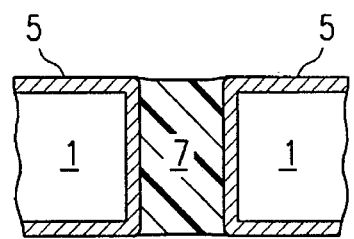
Figure 1D:
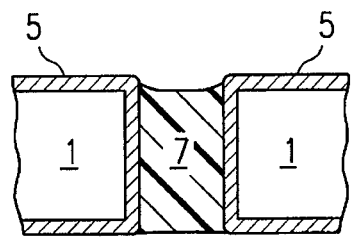
Figure 1E:
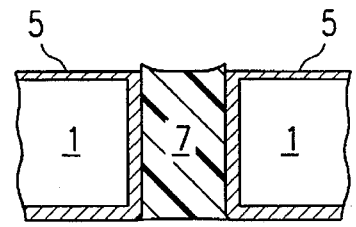
Figure 1F:
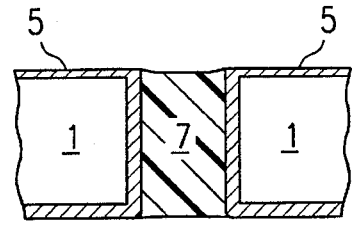

Referring first to FIG. 1a, there is shown a portion of a first multilayer printed wiring board 1 having a via 3 extending therethrough, the board and via having been plated with copper 5 in standard manner, the copper extending through the via and on both the upper and lower surfaces of the board. Though only a single via 3 is shown, it should be understood that the board 1 would generally include plural vias therethrough. The via 3 is then filled with an epoxy 7, the epoxy possibly extending over a portion of the copper 5 in the vicinity of the via as shown in FIG. 1b. The epoxy 7, if extending over the copper 5 is then removed by mechanical, chemical or plasma methods, such as sand papering, to provide an essentially planar surface of copper and epoxy as shown in FIG. 1c. The epoxy 7 is then etched back to below the surface of the copper 5 but above the top surface of the board 1 as shown in FIG. 1d. The copper 5 on the surface is then partially removed to a thickness of from about 0.2 mils to about 0.5 mils, permitting a portion of the epoxy 7 in the form of a nub to extend above the surface of the etched back copper 5 as shown in FIG. 1e. The epoxy 7 extending above the copper 5 is then removed to provide a planar surface of copper and epoxy, the copper layer having been reduced in thickness sufficiently, as shown in FIG. 1f, so that further processing can now take place with the formation of an additional plated copper layer.

Figure 2:
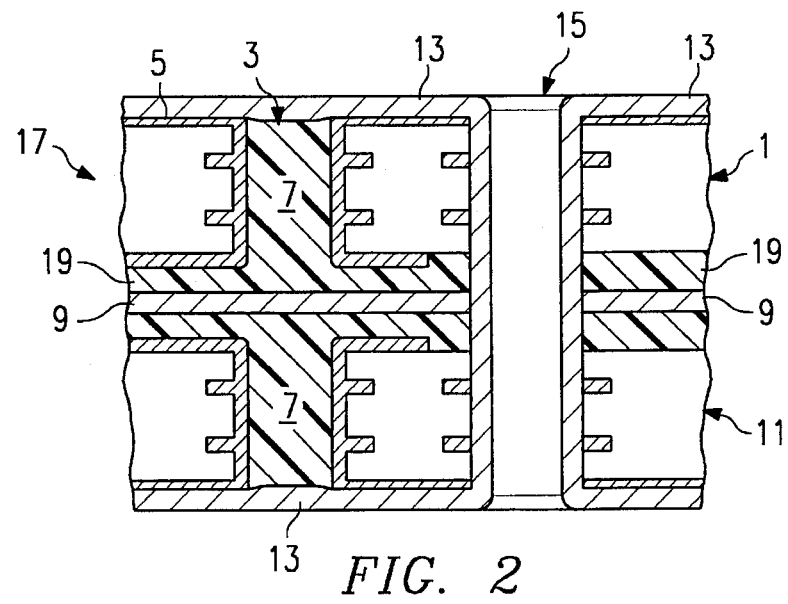
FIG. 2 is a cross section of a module formed in accordance with the present invention and using the printed wiring board of FIG. 1.

Referring now to FIG. 2, there is shown a module 17 in accordance with the present invention including a first printed wiring board 1 as described with reference to FIGS. 1a to 1f, a core layer 9 of metal or other rigid material such as a C-stage epoxy and a second printed wiring board 11 as described with reference to FIGS. 1a to 1f. The printed wiring boards 1 and 11 are secured to the core layer 9 by a B-stage adhesive, preferably a partially cured epoxy adhesive 19 which extends to the epoxy 7. After fabrication of the printed wiring boards 1 and 11 as described above with reference to FIGS. 1a to 1f, and securing the boards to the core 9, a via 15 is formed which extends through the wiring boards 1 and 11 and the core 9. The module 17 is then plated in standard manner to provide a layer of copper 13 on the upper and lower surfaces of the module and in the via 15, this plating operation providing additional copper over the copper layer 5. However, since the thickness of the copper layer 5 had been previously reduced as described hereinabove, the final layer of copper 5 with copper layer 13 thereon, after plating in via 15, will still be of sufficiently reduced thickness to now permit patterning of the copper layer 13 and etching of thin lines and narrow spacing between lines with high yields relative to the prior art.

Though the via 15 in FIG. 2 has been described as being formed after securing the printed wiring boards 1 and 11 to the core 9, portions of the via 15 and copper plating could also be formed on the individual boards 1 and 11 and core 9 before final fabrication of the module 17.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of making a printed wiring board comprising the steps of:

(a) providing a board having a pair of major opposing surfaces, a via having walls extending between said surfaces and a layer of electrically conductive material having thickness disposed on at least one said surface and extending along the walls of said via;

(b) protecting said electrically conductive material disposed in said via against a subsequent etching of said electrically conductive material on said at least one said surface; and (c) reducing the thickness of said layer of electrically conductive material on said at least one said surface to a lesser finite thickness.

2. The method of claim 1 wherein said electrically conductive material is copper.

3. The method of claim 1 wherein said step of protecting includes the step of filling the remaining portion of said via with a material inert to subsequent etchants for said electrically conductive material.

4. The method of claim 2 wherein said step of protecting includes the step of filling the remaining portion of said via with a material inert to subsequent etchants for said electrically conductive material.

5. The method of claim 3 wherein said material is an epoxy.

6. The method of claim 4 wherein said material is an epoxy.

7. The method of claim 3 further including the step of removing a portion of said material inert to subsequent etchants to a level intermediate the exposed surface of said electrically conductive material in step (a) and the opposing surface of said electrically conductive material.

8. The method of claim 4 further including the step of removing a portion of said material inert to subsequent etchants to a level intermediate the exposed surface of said electrically conductive material in step (a) and the opposing surface of said electrically conductive material.

9. The method of claim 5 further including the step of removing a portion of said material inert to subsequent etchants to a level intermediate the exposed surface of said electrically conductive material in step (a) and the opposing surface of said electrically conductive material.

10. The method of claim 6 further including the step of removing a portion of said material inert to subsequent etchants to a level intermediate the exposed surface of said electrically conductive material in step (a) and the opposing surface of said electrically conductive material.

11. A method of fabricating a printed wiring board module comprising the steps of:

(a) providing a first board having a pair of major opposing surfaces, a via having walls extending between said surfaces and a layer of electrically conductive material having thickness disposed on at least one said surface and extending along the walls of said via;

(b) protecting said electrically conductive material disposed in said via against a subsequent etching of said electrically conductive material on said at least one said surface;

(c) reducing the thickness of said layer of electrically conductive material on said at least one said surface to a lesser finite thickness;

(d) providing a core layer and a second board;

(e) securing said first and second boards to opposing sides of said core layer;

(f) forming a second via having walls and extending through said first and second boards and said core layer;

(g) forming a layer of electrically conductive material on said walls of said second via and said at least one said surface; and (h) patterning and etching said electrically conductive material on said at least one surface to form an electrically conductive pattern.

12. The method of claim 11 wherein said electrically conductive material is copper.

13. The method of claim 11 wherein said step of protecting includes the step of filling the remaining portion of said via with a material inert to subsequent etchants for said electrically conductive material.

14. The method of claim 12 wherein said step of protecting includes the step of filling the remaining portion of said via with a material inert to subsequent etchants for said electrically conductive material.

15. The method of claim 13 wherein said material is an epoxy.

16. The method of claim 14 wherein said material is an epoxy.

17. The method of claim 13 further including the step of removing a portion of said material inert to subsequent etchants to a level intermediate the exposed surface of said electrically conductive material in step (a) and the opposing surface of said electrically conductive material.

18. The method of claim 14 further including the step of removing a portion of said material inert to subsequent etchants to a level intermediate the exposed surface of said electrically conductive material in step (a) and the opposing surface of said electrically conductive material.

19. The method of claim 15 further including the step of removing a portion of said material inert to subsequent etchants to a level intermediate the exposed surface of said electrically conductive material in step (a) and the opposing surface of said electrically conductive material.

20. The method of claim 16 further including the step of removing a portion of said material inert to subsequent etchants to a level intermediate the exposed surface of said electrically conductive material in step (a) and the opposing surface of said electrically conductive material.

* * * * *